(12) United States Patent
Wang et al.

(10) Patent No.: US 9,859,364 B1
(45) Date of Patent: Jan. 2, 2018

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventors: Sheng-Hsiung Wang, Hsinchu County (TW); Bao-Ru Young, Hsinchu County (TW); Tung-Heng Hsieh, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/448,709

(22) Filed: Mar. 3, 2017

(51) Int. Cl.
| H01L 21/82 | (2006.01) |
| H01L 29/06 | (2006.01) |
| H01L 29/78 | (2006.01) |
| H01L 29/08 | (2006.01) |
| H01L 23/535 | (2006.01) |
| H01L 29/49 | (2006.01) |
| H01L 29/66 | (2006.01) |
| H01L 21/768 | (2006.01) |

(52) U.S. Cl.
CPC .... *H01L 29/0649* (2013.01); *H01L 21/76805* (2013.01); *H01L 21/76843* (2013.01); *H01L 21/76895* (2013.01); *H01L 23/535* (2013.01); *H01L 29/0847* (2013.01); *H01L 29/4983* (2013.01); *H01L 29/66795* (2013.01); *H01L 29/7851* (2013.01)

(58) Field of Classification Search
CPC .............. H01L 21/823431; H01L 29/785
See application file for complete search history.

(56) References Cited

U.S. PATENT DOCUMENTS

| 7,667,271 | B2 | 2/2010 | Yu et al. |
| 7,910,453 | B2 | 3/2011 | Xu et al. |
| 8,377,779 | B1 | 2/2013 | Wang |
| 8,399,931 | B2 | 3/2013 | Liaw et al. |
| 8,652,894 | B2 | 2/2014 | Lin et al. |
| 8,686,516 | B2 | 4/2014 | Chen et al. |
| 8,716,765 | B2 | 5/2014 | Wu et al. |
| 8,723,272 | B2 | 5/2014 | Liu et al. |
| 8,729,627 | B2 | 5/2014 | Cheng et al. |
| 8,735,993 | B2 | 5/2014 | Lo et al. |
| 8,736,056 | B2 | 5/2014 | Lee et al. |
| 8,772,109 | B2 | 7/2014 | Colinge |

(Continued)

*Primary Examiner* — Mark Prenty
(74) *Attorney, Agent, or Firm* — McClure, Qualey & Rodack, LLP

(57) ABSTRACT

A semiconductor device includes a substrate, a source/drain feature, a gate structure, a top interlayer dielectric (ILD), a contact, and an isolation pillar. The source/drain feature is at least partially disposed in the substrate. The gate structure is disposed on the substrate and adjacent to the source/drain feature. The top ILD is disposed on the gate structure. The contact is disposed on the source/drain feature. The contact includes a barrier metal and a contact metal. The barrier metal is disposed on and in contact with the source/drain feature. The contact metal is disposed on the barrier metal. The isolation pillar is disposed adjacent to the contact. The isolation pillar is in contact with the barrier metal and the contact metal of the contact and the top ILD.

20 Claims, 18 Drawing Sheets

(56) References Cited

U.S. PATENT DOCUMENTS

| | | |
|---|---|---|
| 8,785,285 B2 | 7/2014 | Tsai et al. |
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,196,613 B2 * | 11/2015 | Basker ................ H01L 27/0924 |
| 2014/0001574 A1 | 1/2014 | Chen et al. |
| 2014/0110755 A1 | 4/2014 | Colinge |
| 2014/0151812 A1 | 6/2014 | Liaw |

* cited by examiner

SEMICONDUCTOR DEVICE AND MANUFACTURING METHOD THEREOF

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. Such scaling down has also increased the complexity of processing and manufacturing ICs.

In ICs, semiconductor devices are formed on semiconductor substrates, and are connected through metallization layers. The metallization layers are connected to the semiconductor devices through contact plugs. Also, external pads are connected to the semiconductor devices through the contact plugs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A to 5A are perspective views of a method for manufacturing a semiconductor device at various stages in accordance with some embodiments of the present disclosure.

FIGS. 1B to 5B are cross-sectional view respectively taking along line A-A of FIGS. 1A to 5A.

FIGS. 1C to 5C are cross-sectional view respectively taking along line B-B of FIGS. 1A to 5A.

FIGS. 1D to 5D are cross-sectional view respectively taking along line C-C of FIGS. 1A to 5A.

FIGS. 6A to 9A are perspective views of a method for manufacturing a semiconductor device at various stages in accordance with some embodiments of the present disclosure.

FIGS. 6B to 9B are cross-sectional view respectively taking along line A-A of FIGS. 6A to 9A.

FIGS. 6C to 9C are cross-sectional view respectively taking along line B-B of FIGS. 6A to 9A.

FIGS. 6D to 9D are cross-sectional view respectively taking along line C-C of FIGS. 6A to 9A.

DETAILED DESCRIPTION

Figure 1A:
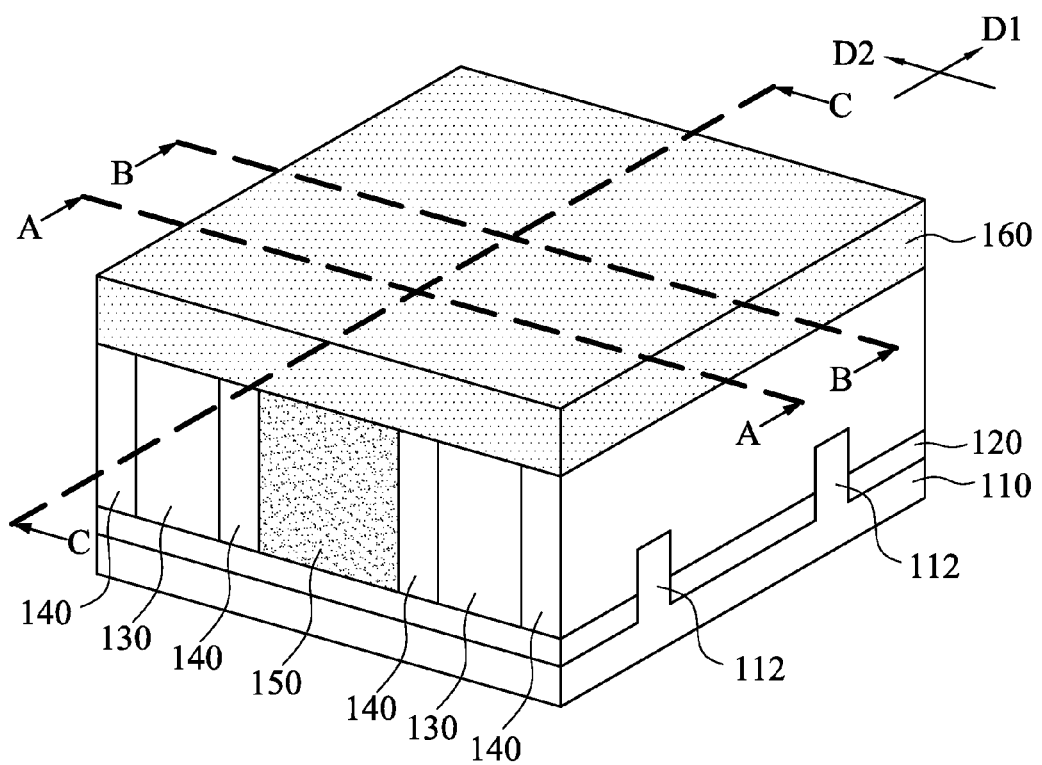
Figure 1B:
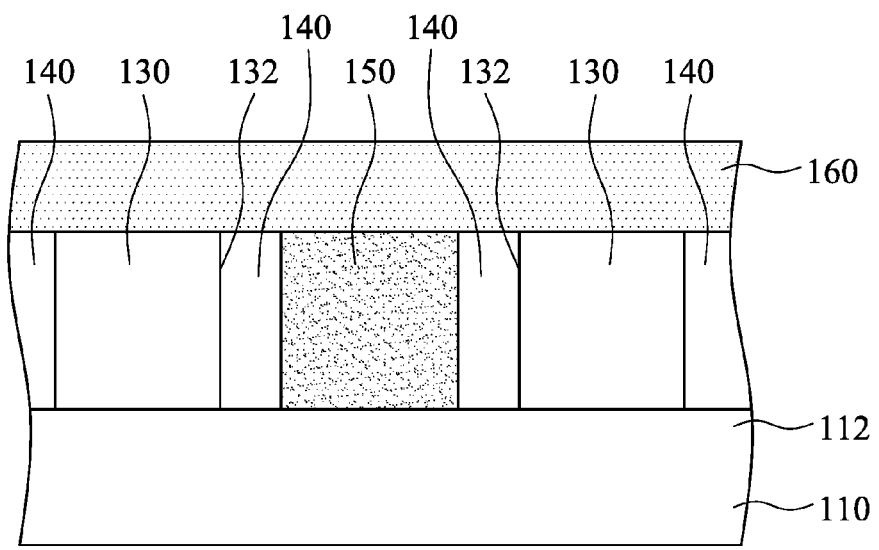

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments of the present disclosure provide some improved methods for the formation of semiconductor devices and the resulting structures. These embodiments are discussed below in the context of forming finFET transistors having a single fin or multiple fins on a bulk silicon substrate. One of ordinary skill in the art will realize that embodiments of the present disclosure may be used with other configurations, such as a planar-type transistor.

FIGS. 1A to 5A are perspective views of a method for manufacturing a semiconductor device at various stages in accordance with some embodiments of the present disclosure, FIGS. 1B to 5B are cross-sectional view respectively taking along line A-A of FIGS. 1A to 5A, FIGS. 1C to 5C are cross-sectional view respectively taking along line B-B of FIGS. 1A to 5A, and FIGS. 1D to 5D are cross-sectional view respectively taking along line C-C of FIGS. 1A to 5A. Reference is made to FIGS. 1A to 1D. A substrate 110 is provided. In some embodiments, the substrate 110 may include silicon (Si). Alternatively, the substrate 110 may include germanium (Ge), silicon germanium, gallium arsenide (GaAs) or other appropriate semiconductor materials. Also alternatively, the substrate 110 may include an epitaxial layer. For example, the substrate 110 may have an epitaxial layer overlying a bulk semiconductor. Further, the substrate 110 may be strained for performance enhancement. For example, the epitaxial layer may include a semiconductor material different from those of the bulk semiconductor such as a layer of silicon germanium overlying a bulk silicon or a layer of silicon overlying a bulk silicon germanium formed by a process including selective epitaxial growth (SEG). Furthermore, the substrate 110 may include a semiconductor-on-insulator (SOI) structure such as a buried dielectric layer. Also alternatively, the substrate 110 may include a buried dielectric layer such as a buried oxide (BOX) layer, such as that formed by a method referred to as separation by implantation of oxygen (SIMOX) technology, wafer bonding, SEG, or other appropriate method. In various embodiments may include any of a variety of substrate structures and material.

Figure 1C:
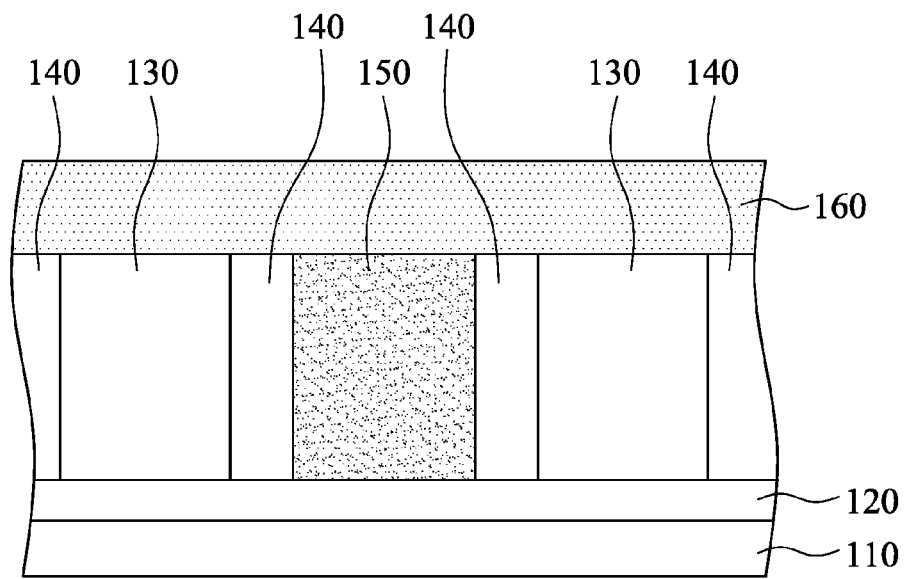
Figure 1D:
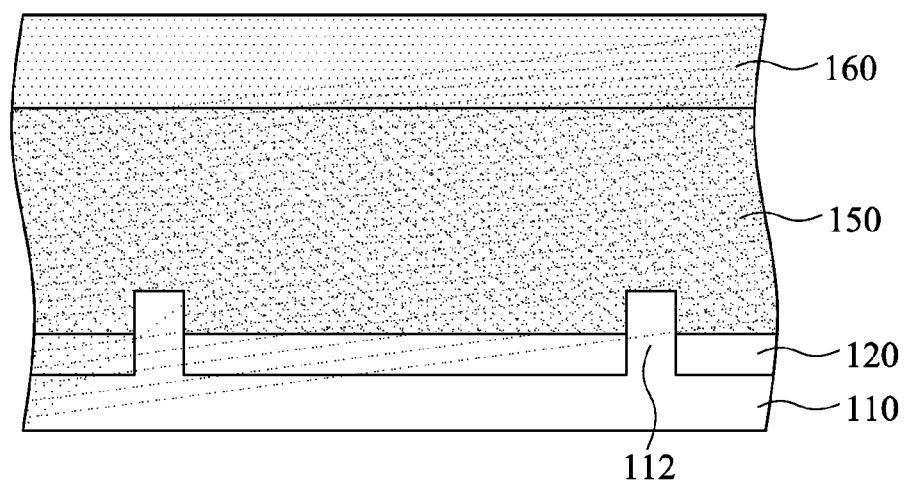
Figure 2A:
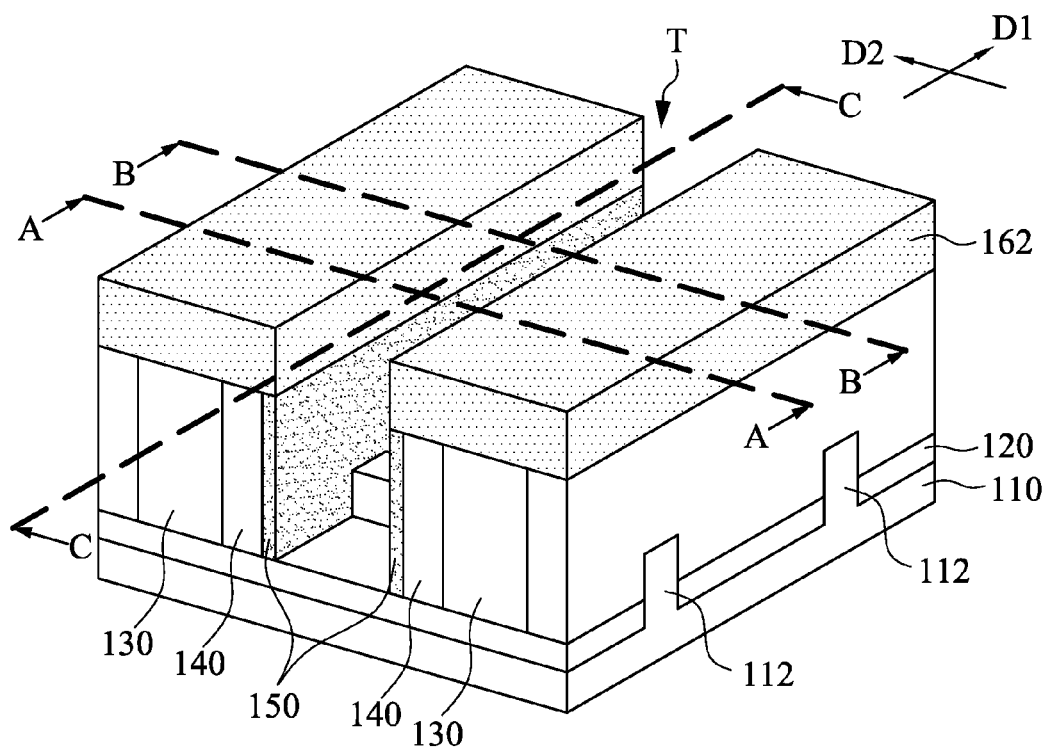
Figure 2B:
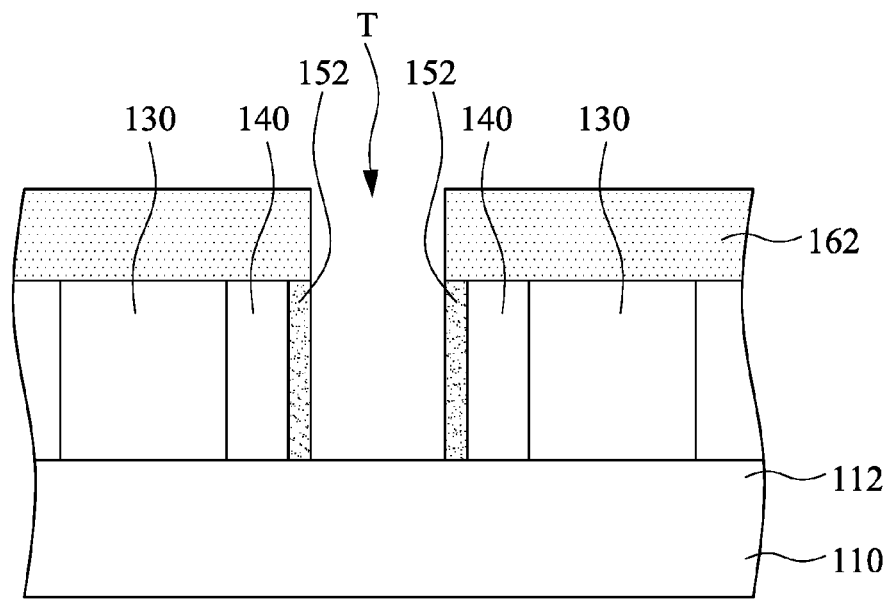
Figure 2C:
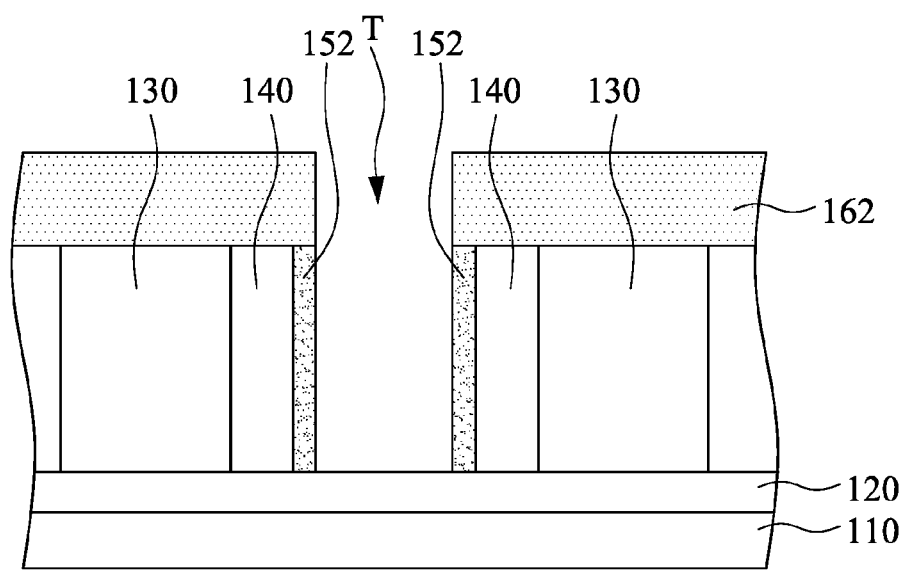
Figure 2D:
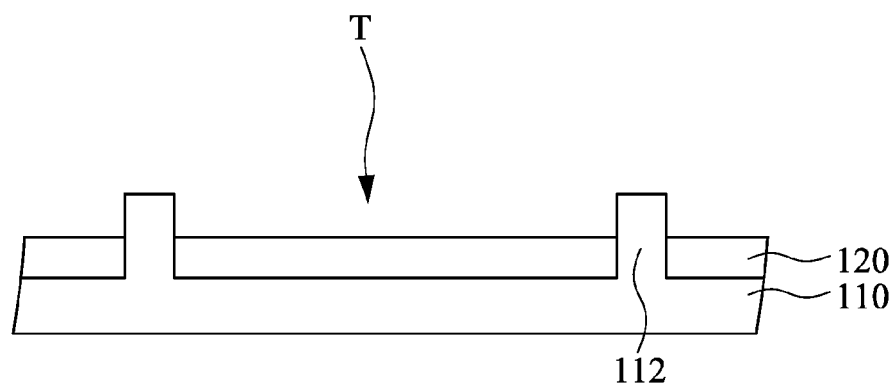
Figure 3A:
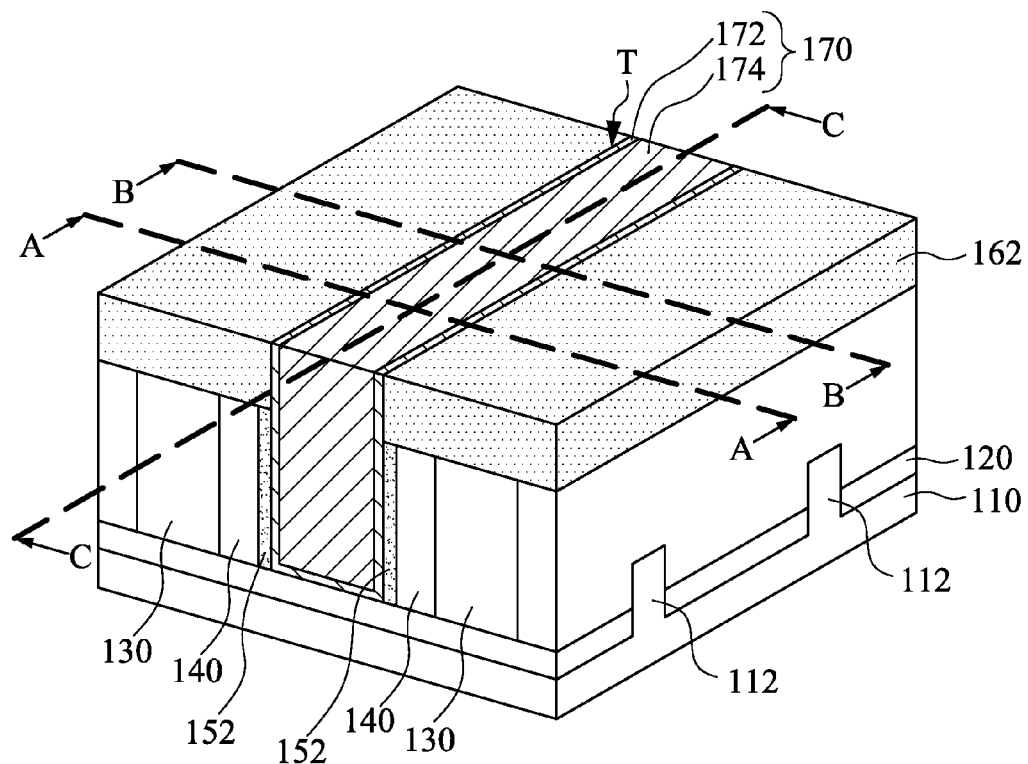
Figure 3B:
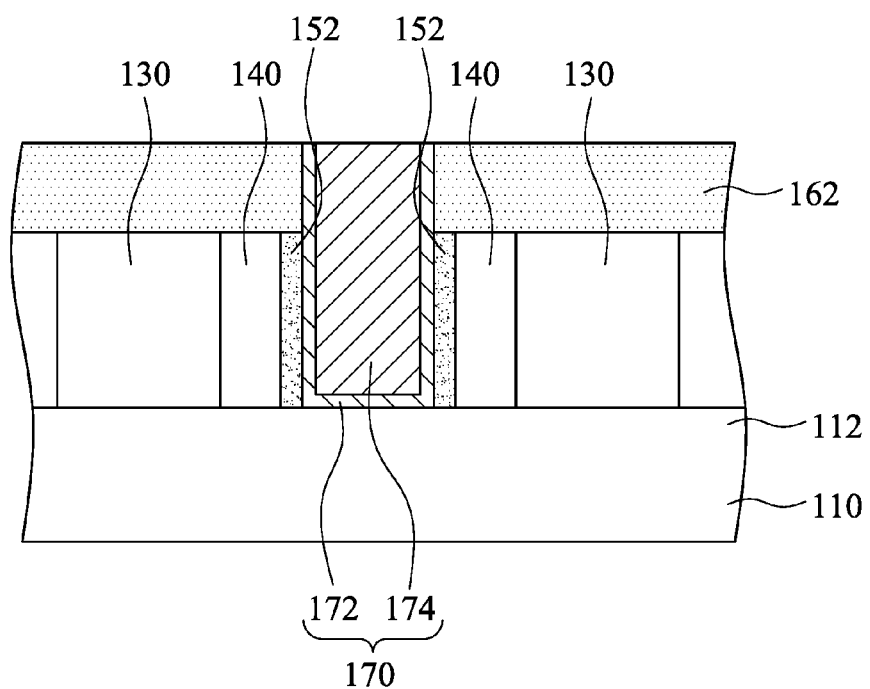
Figure 3C:
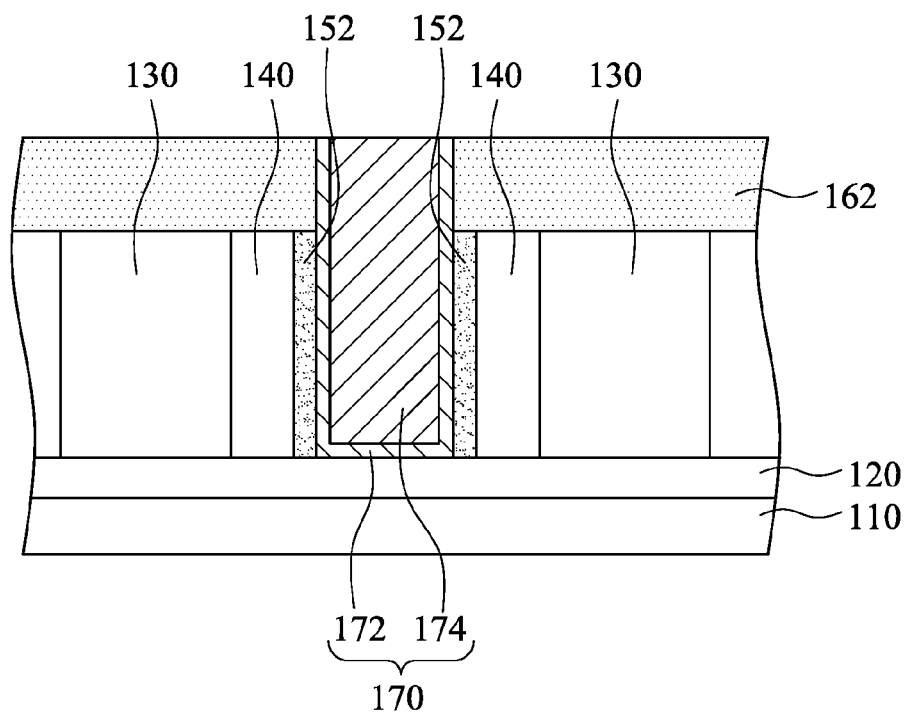
Figure 3D:
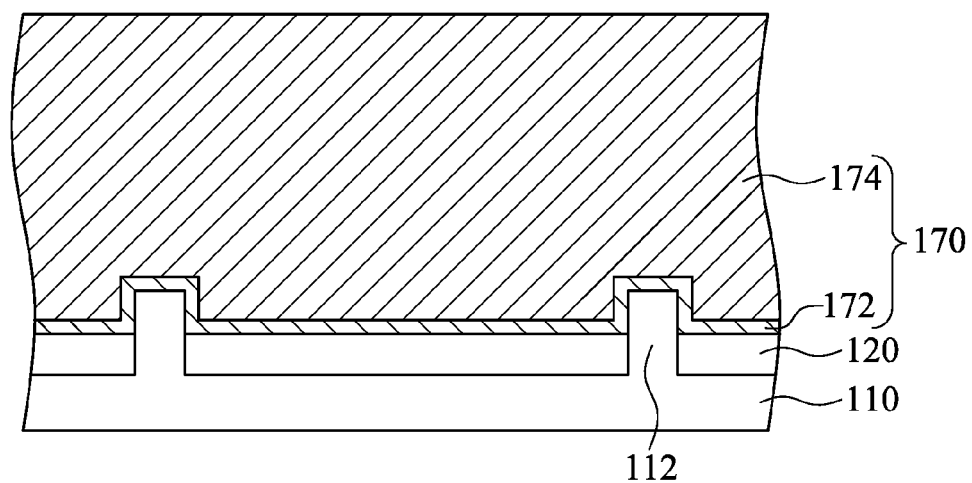
Figure 4A:
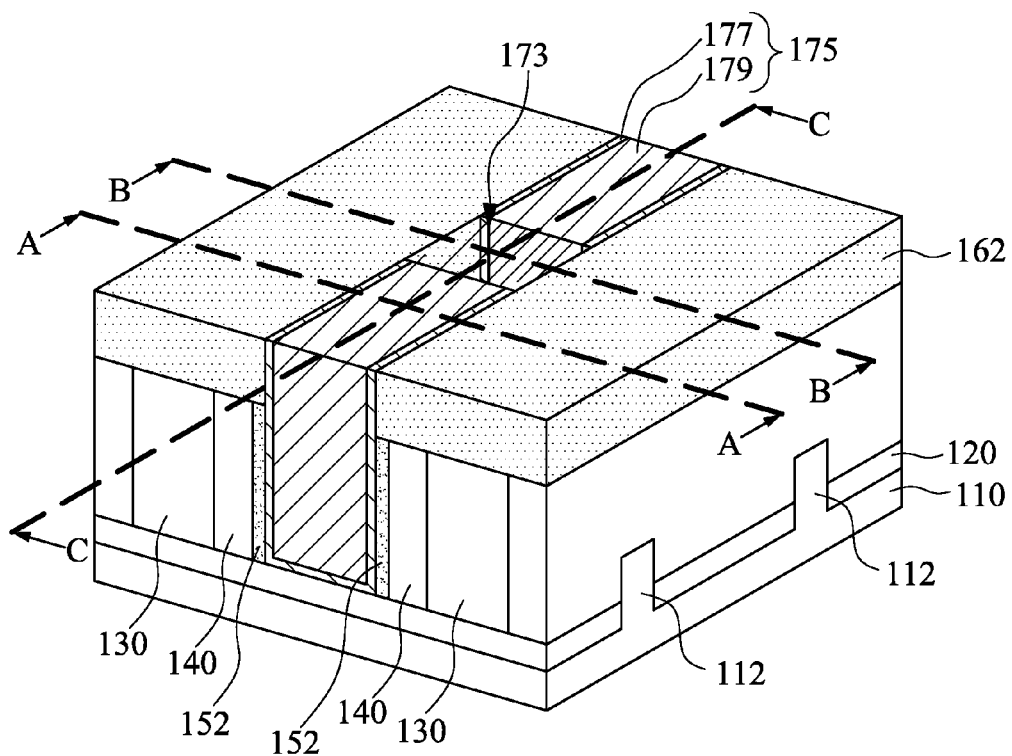
Figure 4B:
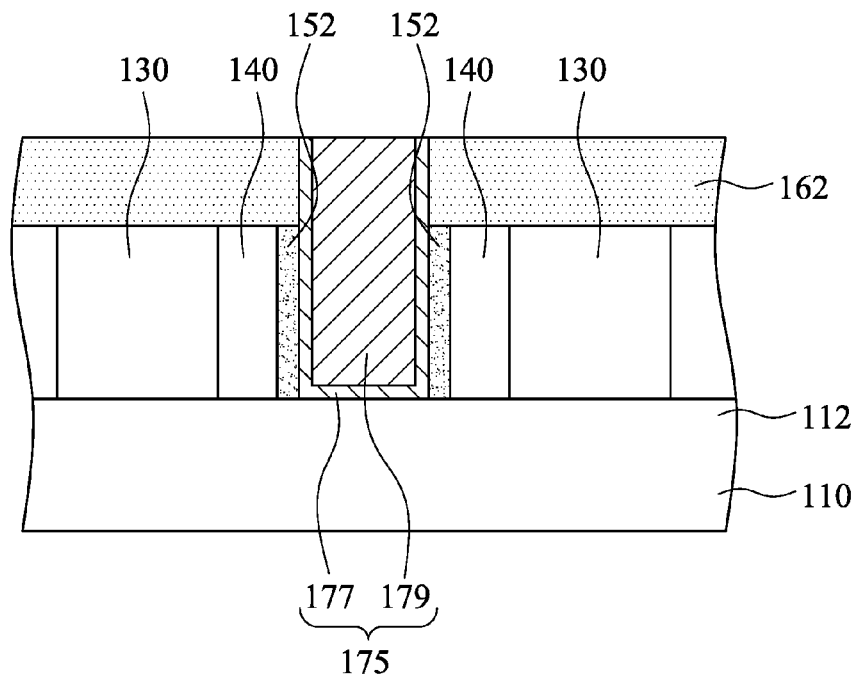
Figure 4C:
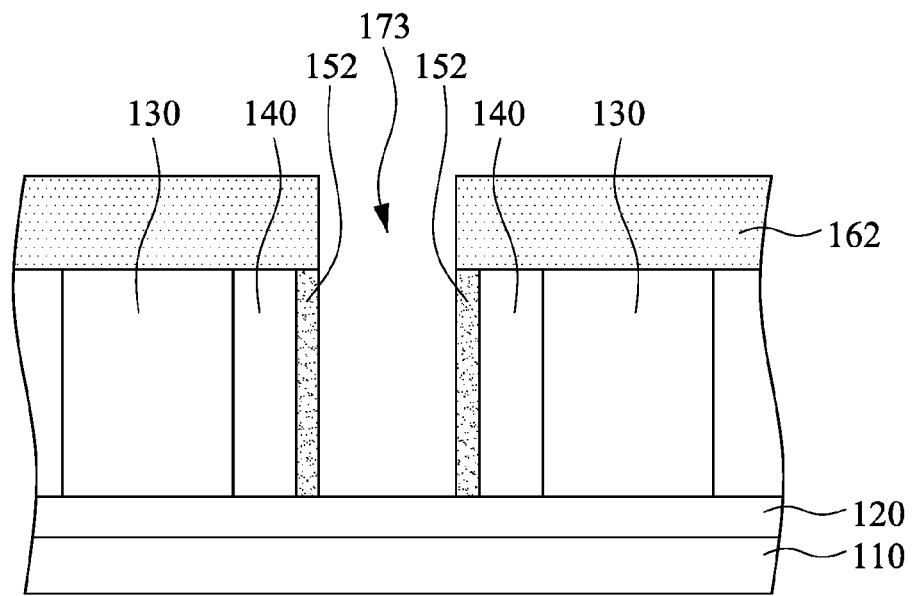
Figure 4D:
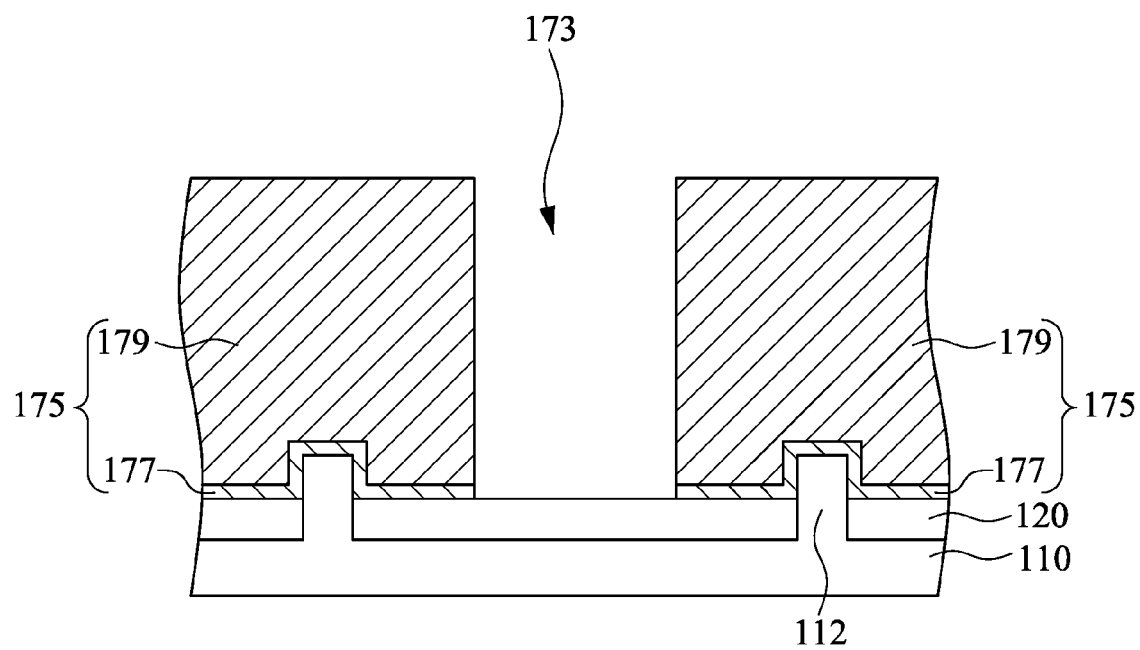

The substrate 110 further includes a plurality of semiconductor fins 112 protruded from the substrate 110. The semiconductor fins 112 serve as source/drain features of transistors. It is note that the numbers of the semiconductor fins 112 in FIGS. 1A and 1C are illustrative, and should not limit the claimed scope of the present disclosure. A person having ordinary skill in the art may select suitable numbers for the semiconductor fins 112 according to actual situations. The semiconductor fins 112 may be formed, for example, by patterning and etching the substrate 110 using photolithography techniques. In some embodiments, a layer of photoresist material (not shown) is deposited over the substrate 110. The layer of photoresist material is irradiated (exposed) in accordance with a desired pattern (the semiconductor fins 112 in this case) and developed to remove a portion of the photoresist material. The remaining photoresist material protects the underlying material from subsequent processing steps, such as etching. It should be noted that other masks, such as an oxide or silicon nitride mask, may also be used in the etching process.

In some other embodiments, the semiconductor fins 112 may be epitaxially grown. For example, exposed portions of an underlying material, such as an exposed portion of the substrate 110, may be used in an epitaxial process to form the semiconductor fins 112. A mask may be used to control the shape of the semiconductor fins 112 during the epitaxial growth process.

A plurality of isolation features 120, such as shallow trench isolation (STI), formed in the substrate 110 to separate various devices. The formation of the isolation features 120 may include etching a trench in the substrate 110 and filling the trench by insulator materials such as silicon oxide, silicon nitride, or silicon oxynitride. The filled trench may have a multi-layer structure such as a thermal oxide liner layer with silicon nitride filling the trench. In some embodiments, the isolation features 120 may be created using a process sequence such as: growing a pad oxide, forming a low pressure chemical vapor deposition (LPCVD) nitride layer, patterning an STI opening using photoresist and masking, etching a trench in the substrate 110, optionally growing a thermal oxide trench liner to improve the trench interface, filling the trench with CVD oxide, and using chemical mechanical planarization (CMP) to remove the excessive dielectric layers.

At least one gate structure 130 is formed on the substrate 110. For example, in FIGS. 1A-1D, two gate structures 130 are formed on the substrate 110, and the present disclosure is not limited in this respect. The gate structure 130 has an extension direction D1 which is substantially perpendicular to an extension direction D2 of the semiconductor fins 112. In some embodiments, in order to form the gate structures 130, a gate dielectric layer is formed on the substrate 110, followed by a gate electrode layer. The gate dielectric layer and the gate electrode layer are then patterned, forming the gate dielectric and the gate electrode. As is known in the art, hard masks may be formed on the gate structures for process reasons, wherein the hard masks may include silicon nitride.

The gate dielectric may include various known materials such as a silicon oxide, a silicon nitride, or a silicon oxynitride. Alternatively, the gate dielectric may have high dielectric constant (HK) values. In some embodiments, the gate dielectric includes $HfO_2$. Alternatively, the gate dielectric may include HfSiO, HfSiON, HfTaO, HfTiO, HfZrO, zirconium oxide, aluminum oxide, hafnium dioxide-alumina ($HfO_2$—$Al_2O_3$) alloy, other suitable HK dielectric materials, or combinations thereof. The gate dielectric can be formed by a suitable process such as atomic layer deposition (ALD). Other methods to form the gate dielectric include metal organic chemical vapor deposition (MOCVD), physical vapor deposition (PVD), UV-Ozone Oxidation, or molecular beam epitaxy (MBE).

The gate electrode can be made of polycrystalline-silicon (poly-Si), polycrystalline silicon-germanium (poly-SiGe), or other suitable materials. For example, in some embodiments, the gate electrode 134 includes polysilicon deposited undoped by low-pressure chemical vapor deposition (LPCVD). The polysilicon may also be deposited, for example, by furnace deposition of an in-situ doped polysilicon. Alternatively, the gate electrode may include other suitable materials. Further, the gate electrode may be doped poly-silicon with uniform or non-uniform doping.

In some other embodiments, the gate structures 130 can be metal gates. The gate structures 130 formed may also include gate dielectric layer(s), capping layer(s), fill layer(s), and/or other suitable layers that are desirable in metal gate structures. A work function metal layer included in the gate structures 130 may be an n-type or p-type work function layer. Exemplary p-type work function metals include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function metals include Ti, Ag, TaAl, TaAlC, TiAlN, TaC, TaCN, TaSiN, Mn, Zr, other suitable n-type work function materials, or combinations thereof. The work function layer may include a plurality of layers. The work function layer(s) may be deposited by CVD, PVD, electroplating and/or other suitable process. In some embodiments, the gate structure 130 formed is a p-type metal gate including a p-type work function layer. In some embodiments, the capping layer included in the gate structure 130 may include refractory metals and their nitrides (e.g. TiN, TaN, $W_2N$, TiSiN, TaSiN). The cap layer of the gate structure 130 may be deposited by PVD, CVD, Metal-organic chemical vapor deposition (MOCVD) and ALD. In some embodiments, the fill layer included in the gate structures 130 may include tungsten (W). The metal layer may be deposited by ALD, PVD, CVD, or other suitable process.

A plurality of gate spacers 140 are respectively formed on sidewalls 132 of the gate structures 130. The gate spacer 140 may include a seal spacer and a main spacer (not shown). The gate spacers 140 include one or more dielectric materials, such as silicon oxide, silicon nitride, silicon oxynitride, or combinations thereof. The seal spacers are formed on sidewalls 132 of the gate structures 130 and the main spacers are formed on the seal spacers. In some embodiments, the gate spacers 140 include additional layers. For example, an additional layer (not shown) is formed on the seal spacer and then the main spacer is formed on the additional layer. In some embodiments, the seal spacer includes silicon nitride, the additional layer includes silicon oxide, and the main spacer includes silicon nitride. The seal spacers, the main spacers, and the additional layer are formed by deposition, photolithography, and etch processes in a known manner. The gate spacers 140 can be formed using a deposition method, such as plasma enhanced chemical vapor deposition (PECVD), low-pressure chemical vapor deposition (LPCVD), sub-atmospheric chemical vapor deposition (SACVD), or the like. The formation of the gate spacers 140 may include blanket forming spacer layers, and then performing etching steps to remove the horizontal portions of the spacer layers. The remaining vertical portions of the gate spacer layers form the gate spacers 140.

A dielectric layer, an interlayer dielectric (ILD) 150 for example, is formed to cover the gate structures 130 and the substrate 110. The interlayer dielectric 150 may be formed by chemical vapor deposition (CVD), high-density plasma CVD, spin-on, sputtering, or other suitable methods. In some embodiments, the interlayer dielectric 150 includes silicon oxide. In some other embodiments, the interlayer dielectric 150 may include silicon oxy-nitride, silicon nitride, or a low-k material. In some embodiments, dielectric materials can be deposited to cover the gate structure 130, the gate spacers 140, and the substrate 110, and excessive portions of the dielectric materials above the gate structure 130 are removed by performing a CMP process to form the ILD 150. That is, at least a portion of the ILD 150 is disposed between the two gate electrodes 130, and the ILD 150 may be in contact with the gate spacer 140.

In some embodiments, a replacement gate (RPG) process scheme may be employed. In a RPG process scheme, a dummy polysilicon gate is formed first and is replaced later by a metal gate after high thermal budget processes are performed. In some embodiments, the gate electrode of the dummy polysilicon gate is removed to form an opening with the gate spacers 140 as its sidewall. In some other embodiments, the gate dielectric of the dummy poly silicon gate is removed as well. Alternatively, in some embodiments, the gate electrode is removed while the gate dielectric retains. The gate electrode (and the gate dielectric) may be removed by dry etch, wet etch, or a combination of dry and wet etch. For example, a wet etch process may include exposure to a hydroxide containing solution (e.g., ammonium hydroxide), deionized water, and/or other suitable etchant solutions. The metal gate is then formed in the opening between the gate spacers 140.

Another dielectric layer, an interlayer dielectric (ILD) 160 for example, is then formed on the ILD 150, the gate structures 130, and the gate spacers 140. That is, the ILD 160 is disposed on the ILD 150, the gate structures 130, and the gate spacers 140. The interlayer dielectric 160 may be formed by chemical vapor deposition (CVD), high-density plasma CVD, spin-on, sputtering, or other suitable methods. In some embodiments, the interlayer dielectric 160 includes silicon oxide. In some other embodiments, the interlayer dielectric 160 may include silicon oxy-nitride, silicon nitride, or a low-k material. In some embodiments, the ILDs 150 and 160 are made of same material or different materials, and an interface is formed between the ILDs 150 and 160.

Reference is made to FIGS. 2A-2D. The ILDs 160 and 150 of FIGS. 1A-1D are patterned to form a trench T therein and between the two gate structures 130 by various methods, including a dry etch, a wet etch, or a combination of dry etch and wet etch. The trench T exposes portions of the semiconductor fins 112. In some embodiments, the trench T exposes portions of epitaxial layers if the epitaxial layers are formed on the semiconductor fins 112. The remained ILDs 150 and 160 form ILDs 152 and 162, which are formed as the sidewalls of the trench T. The trench T has an extension direction substantially the same as the extension direction D1 of the gate structure 130.

Reference is made to FIGS. 3A-3D. A conductive strip 170 is formed in the trench T of FIGS. 2A-2D. The conductive strip 170 is electrically connected to the semiconductor fins 112 (and/or the epitaxial layer formed thereon). In some embodiments, metal materials can be filled in the trench T, and the excessive portions of the metal materials are removed by performing a CMP process to form the conductive strip 170. The conductive strip 170 is in contact with the ILDs 152 and 162.

In some embodiments, the conductive strip 170 includes a barrier metal layer 172 and a contact metal layer 174. The barrier metal layer 172 is substantially conformally formed in the trench T, and the contact metal layer 174 is formed on the barrier metal layer 172. The contact metal layer 174 can fill the trench T. In some embodiments, a CMP process is applied to remove excessive the barrier metal layer 172 and the contact metal layer 174 outside the trench T. The barrier metal layer 172 may include metal nitride materials. For example, the barrier metal layer 172 includes Ti, TiN, or combination thereof. In some embodiments, the barrier metal layer 172 includes a single layer or multiple layers. For a multiple-layer configuration, the layers include different compositions of metal nitride from each other. For example, the barrier metal layer 172 has a first metal nitride layer including Ti and a second metal nitride layer including TiN. The contact metal layer 174 can be made of tungsten, aluminum, copper, or other suitable materials.

Reference is made to FIGS. 4A-4D. The conductive strip 170 is patterned to form a through hole 173 therein and between the semiconductor fins 112 and between the gate structures 130, and the remained portions of the conductive strip 170 form two contacts 175. The contact 175 includes a barrier metal 177 and a contact metal 179 disposed on the barrier metal 177. The through hole 173 exposes a portion of the isolation feature 120, and the contacts 175 are respectively and electrically connected to the semiconductor fins 112. In FIGS. 4A-4D, the ILD 152 is disposed between the contact 175 and the gate spacer 140. That is, the contact 175 is in contact with the ILD 150.

Reference is made to FIGS. 5A-5D. An isolation pillar 180 is formed in the through hole 173 (see FIG. 4A). The isolation pillar 180 may be formed by chemical vapor deposition (CVD), high-density plasma CVD, spin-on, sputtering, or other suitable methods. In some embodiments, the isolation pillar 180 includes silicon oxide. In some other embodiments, the isolation pillar 180 may include silicon oxy-nitride, silicon nitride, or a low-k material. In some embodiments, dielectric materials can be deposited on the structure of FIGS. 4A-4D, and excessive portions of the dielectric materials outside the through hole 173 are removed by performing a CMP process to form the isolation pillar 180. As such, the isolation pillar 180 is integrally formed.

Figure 5A:
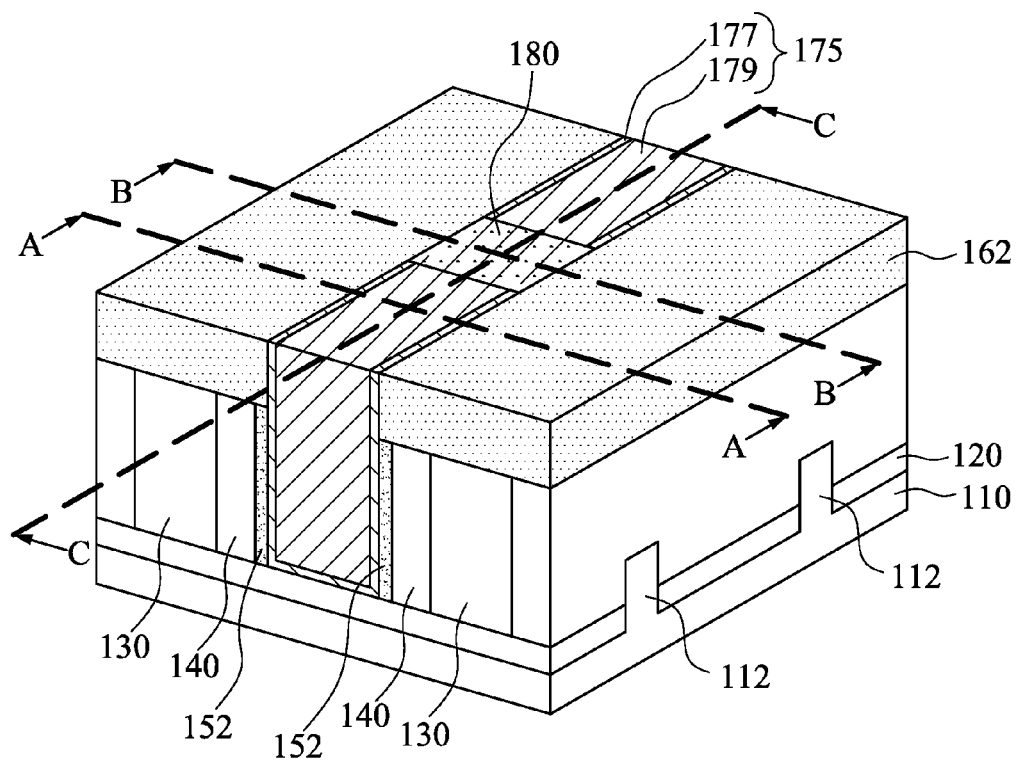
Figure 5B:
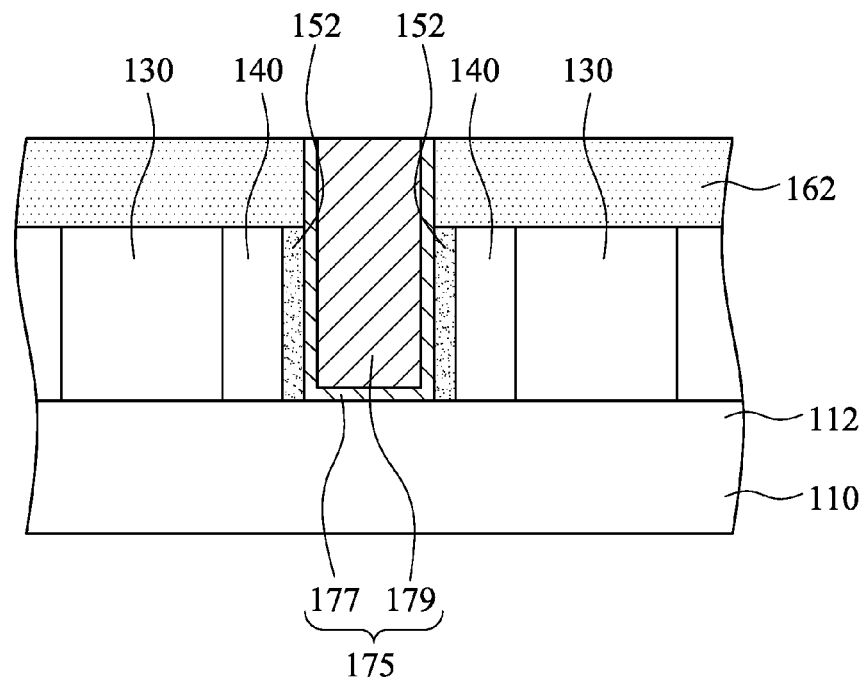

Reference is made to FIG. 5B. The contacts 175 are in contact with the ILDs 152 and 162. The barrier metal 177 of the contacts 175 is in contact with the ILDs 152 and 162, but the contact metal 179 of the contact 175 is separated from the ILDs 152 and 162 by the barrier metal 177.

Figure 5C:
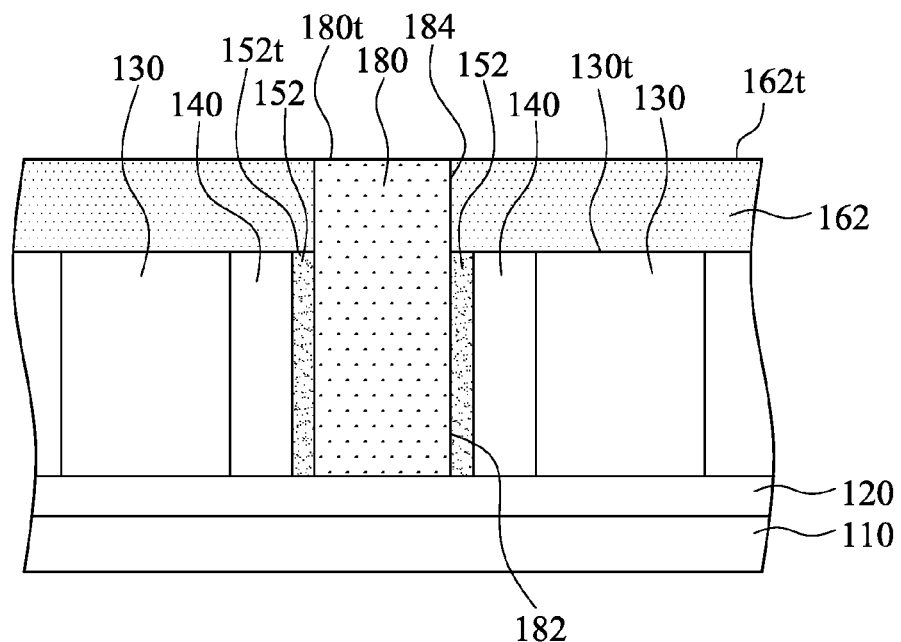

Reference is made to FIG. 5C. The isolation pillar 180 is disposed in the through hole 173, such that the isolation pillar 180 is in contact with the ILDs 152 and 162. An interface 182 is formed between the isolation pillar 180 and one of the ILDs 152, and an interface 184 is formed between the isolation pillar 180 and one of the ILDs 162. The isolation pillar 180 and the ILDs 152 and 162 together form an isolation structure to isolate the two contacts 175. The isolation pillar 180 is disposed between the gate structures 130 but separated from the gate structures 130. That is, the ILD 152 is disposed between the isolation pillar 180 and the gate structure 130. In some embodiments, a top surface 180t of the isolation pillar 180 is higher than a top surface 130t of the gate structure 130, and the top surface 180t is also higher than a top surface 152t of the ILD 152. In some embodiments, the top surface 180t of the isolation pillar 180 and a top surface 162t of the ILD 162 can be substantially co-planar. The term "substantially" as used herein may be applied to modify any quantitative representation which could permissibly vary without resulting in a change in the basic function to which it is related.

Figure 5D:
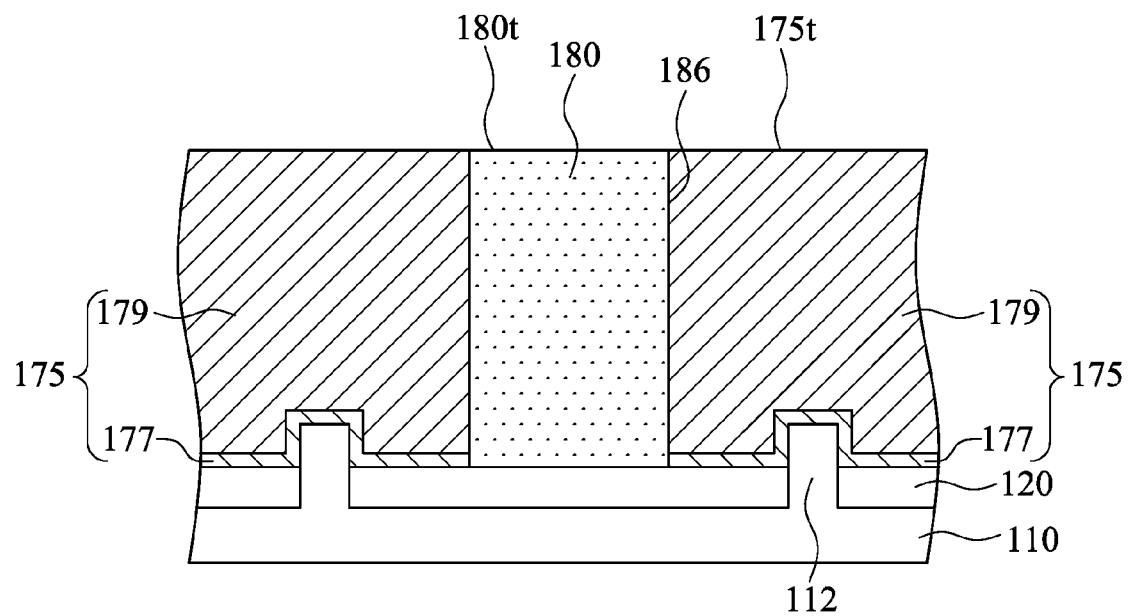

Reference is made to FIG. 5D. The isolation pillar 180 is disposed between the contacts 175 and at least one sidewall 186 of the isolation pillar 180 is in contact with the barrier metal 177 and the contact metal 179 of the contacts 175. The isolation pillar 180 is further in contact with the isolation feature 120 and is separated from the semiconductor fins 112. In some embodiments, the top surface 180t of the isolation pillar 180 and a top surface 175t of the contact 175 can be substantially co-planar.

With such configuration, the size of the isolation pillar 180 can be reduced, and the size of the contacts 175 can be increased even the size of the semiconductor device is shrunk. Furthermore, since the trench T (rather than two individual holes for two individually contacts) is formed, the filling window for the conductive strip 170 is enlarged. Hence, the conductive strip 170 has a good filling performance to provide a good electrical performance between the contacts 175 and the source/drain features (i.e., the semiconductor fins 112 in this case). Also, this configuration can improve the shortage problem between the contacts 175 and the gate structures 130 since the formation of the trench T have a good control rather than the formation of the two individual holes and the contacts 175 can be formed in desired shapes.

Figure 6A:
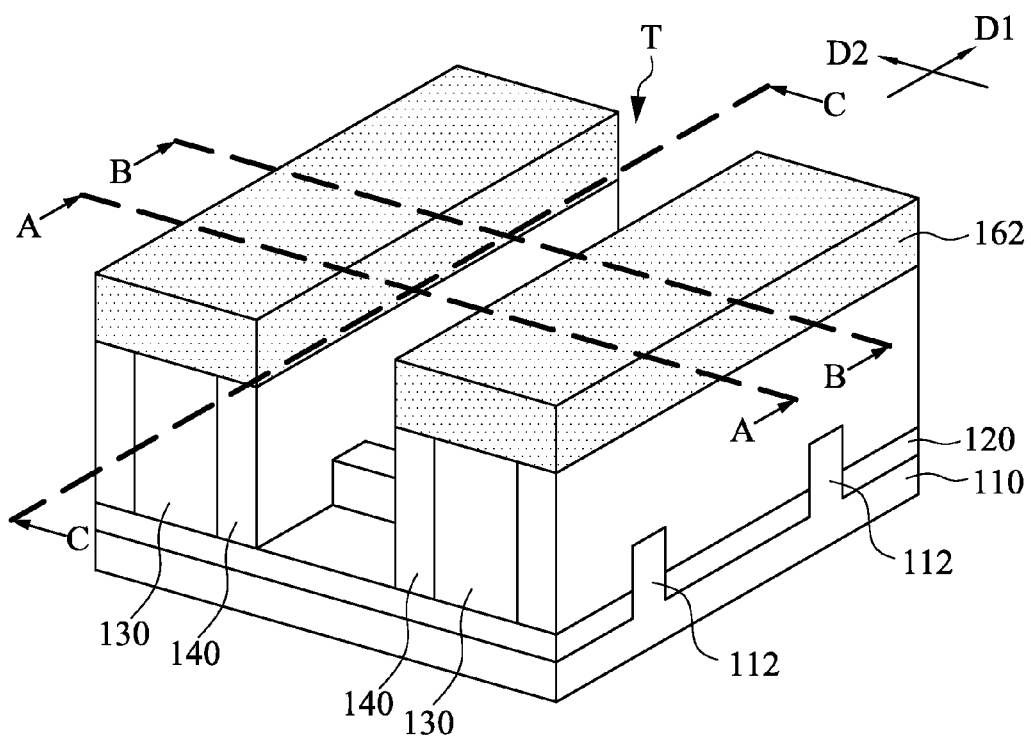
Figure 6B:
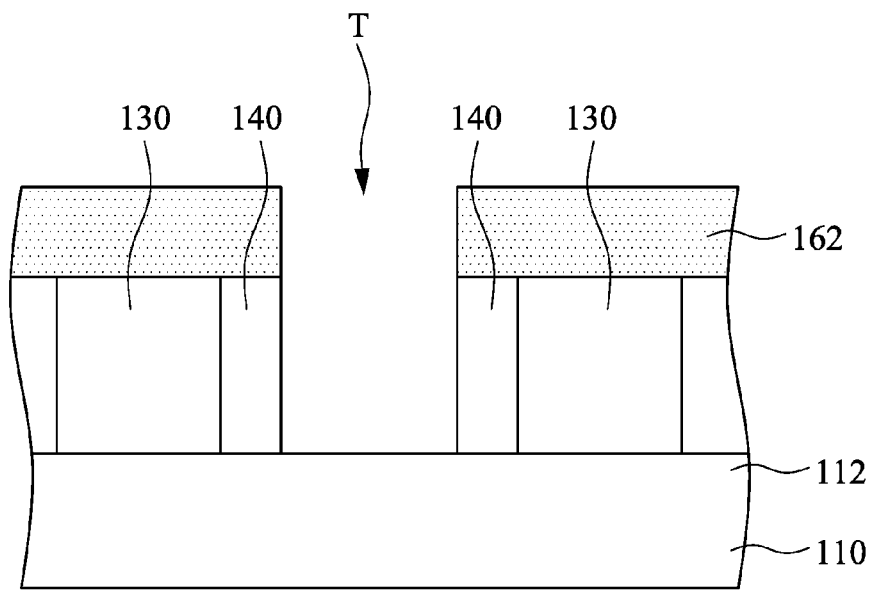
Figure 6C:
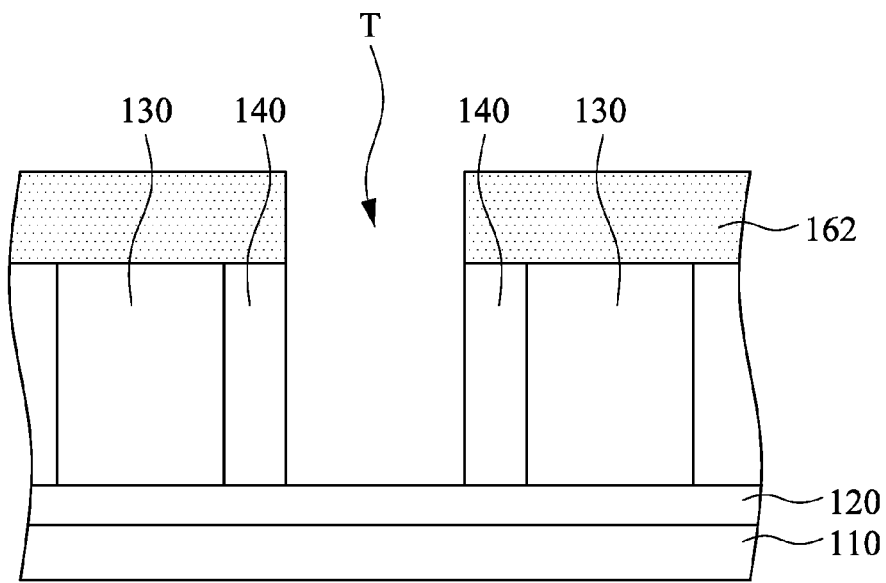
Figure 6D:
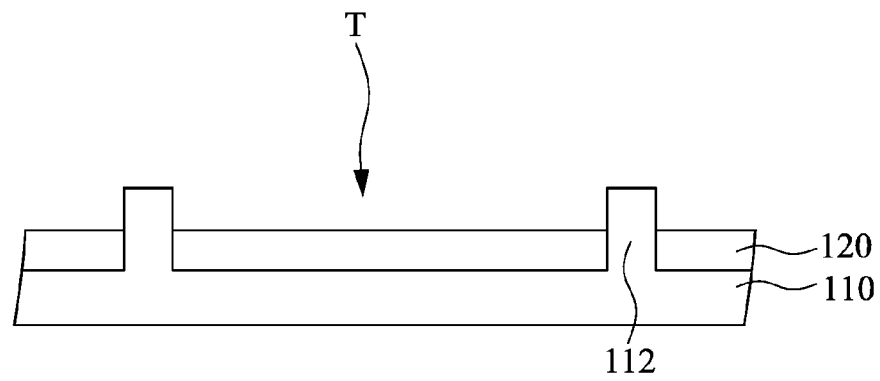
Figure 7A:
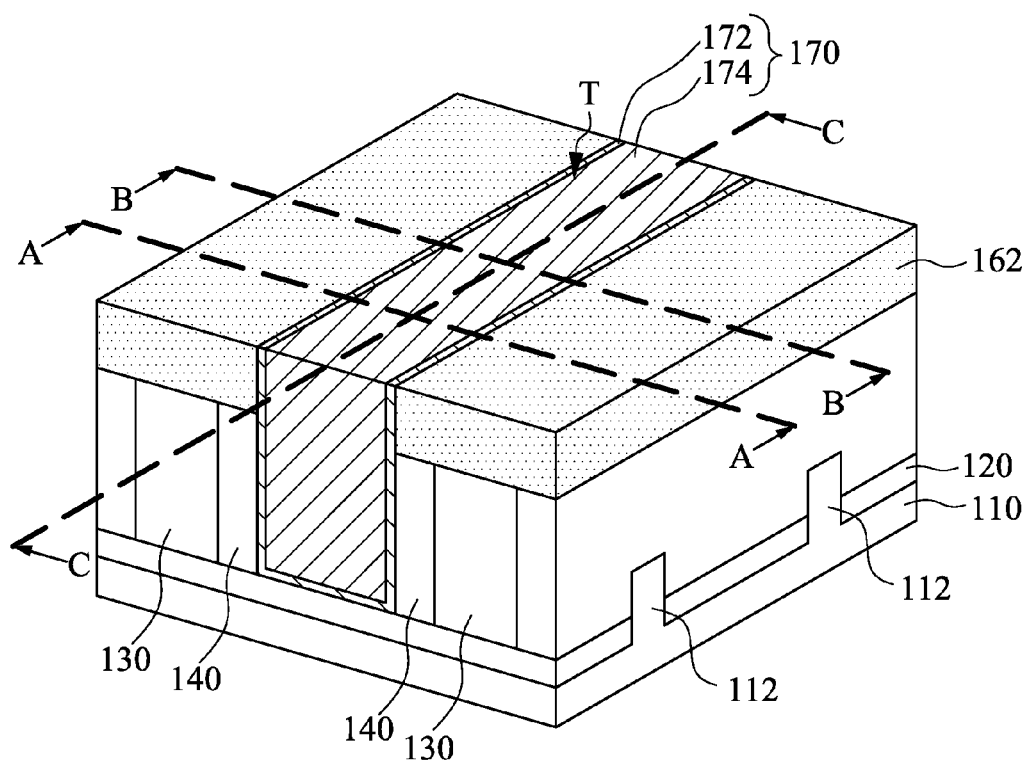
Figure 7B:
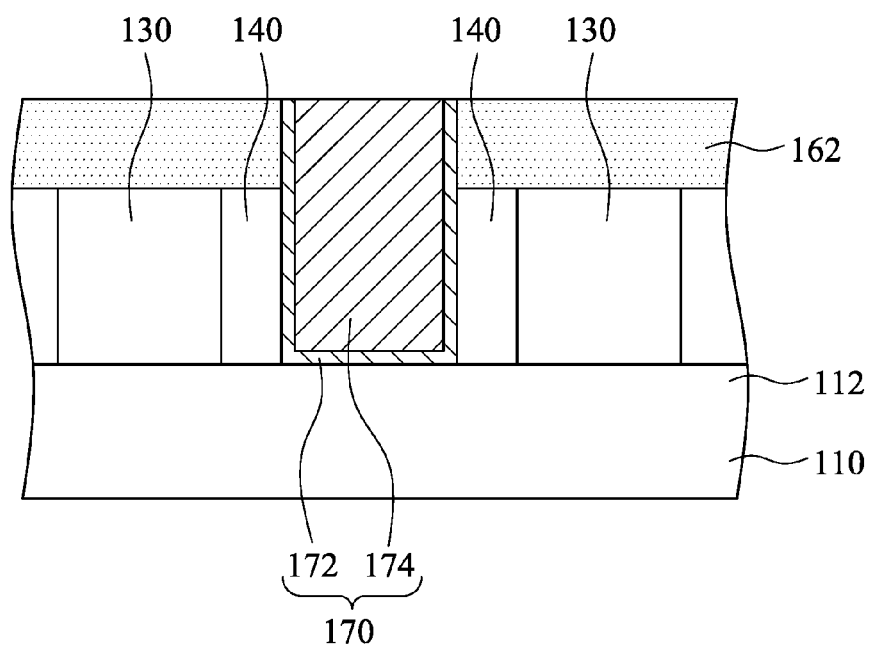
Figure 7C:
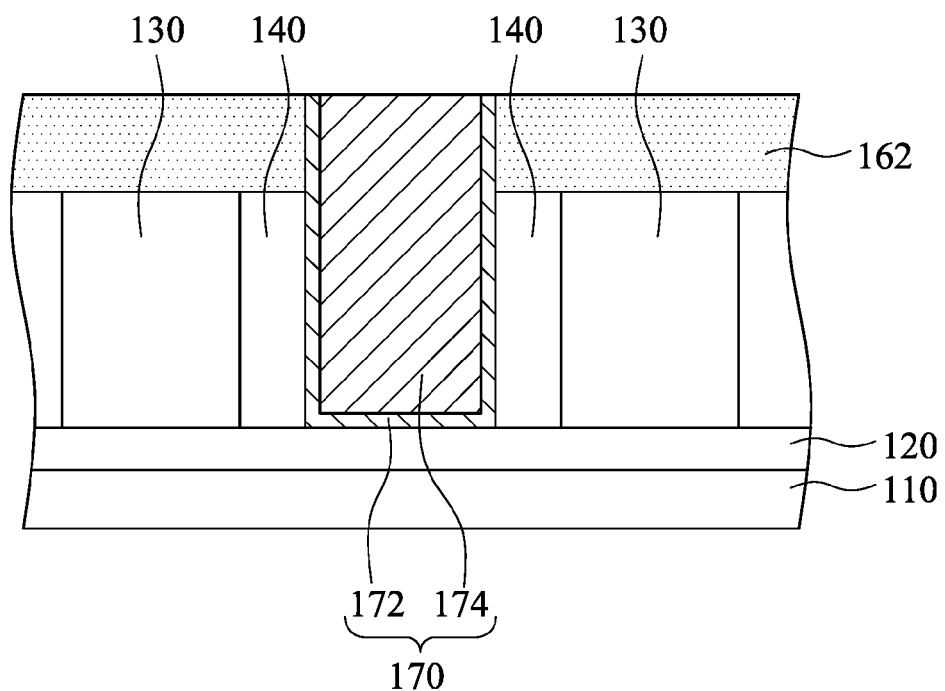
Figure 7D:
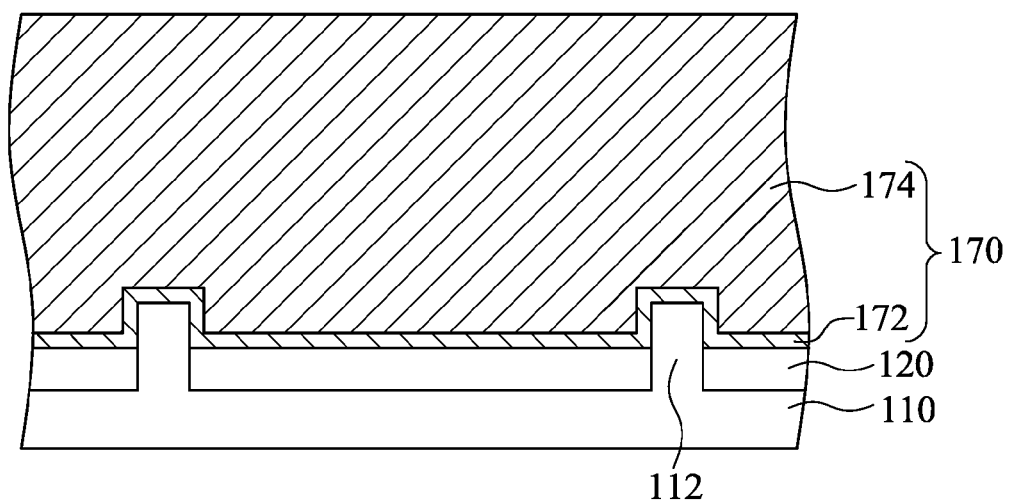
Figure 8A:
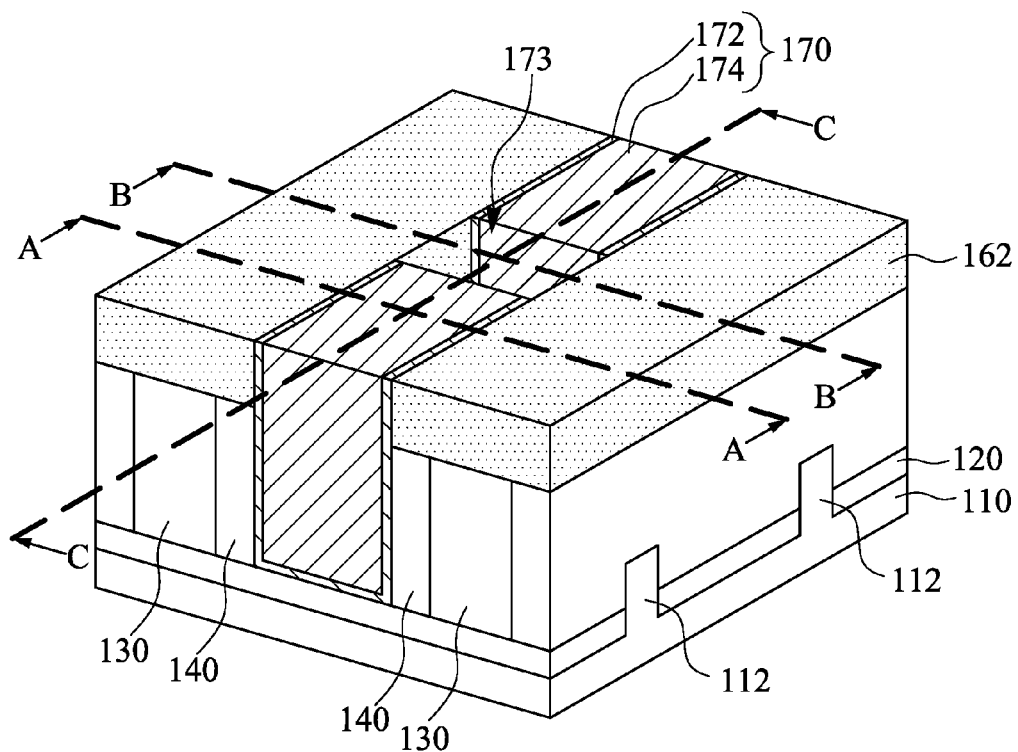
Figure 8B:
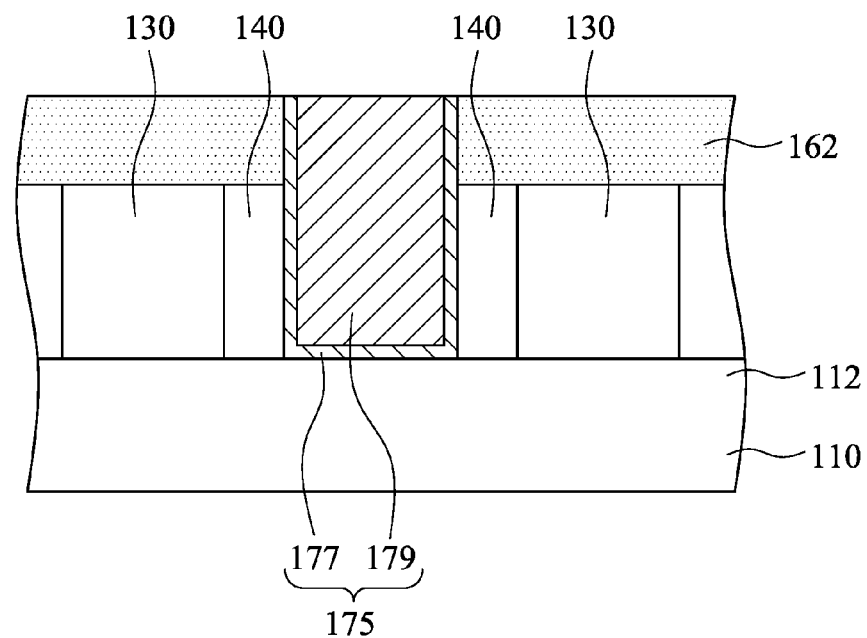
Figure 8C:
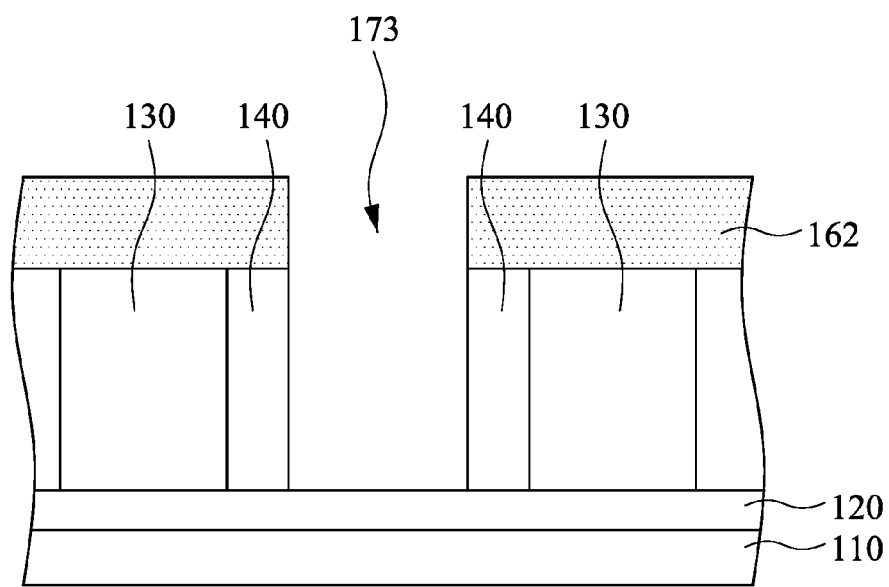
Figure 8D:
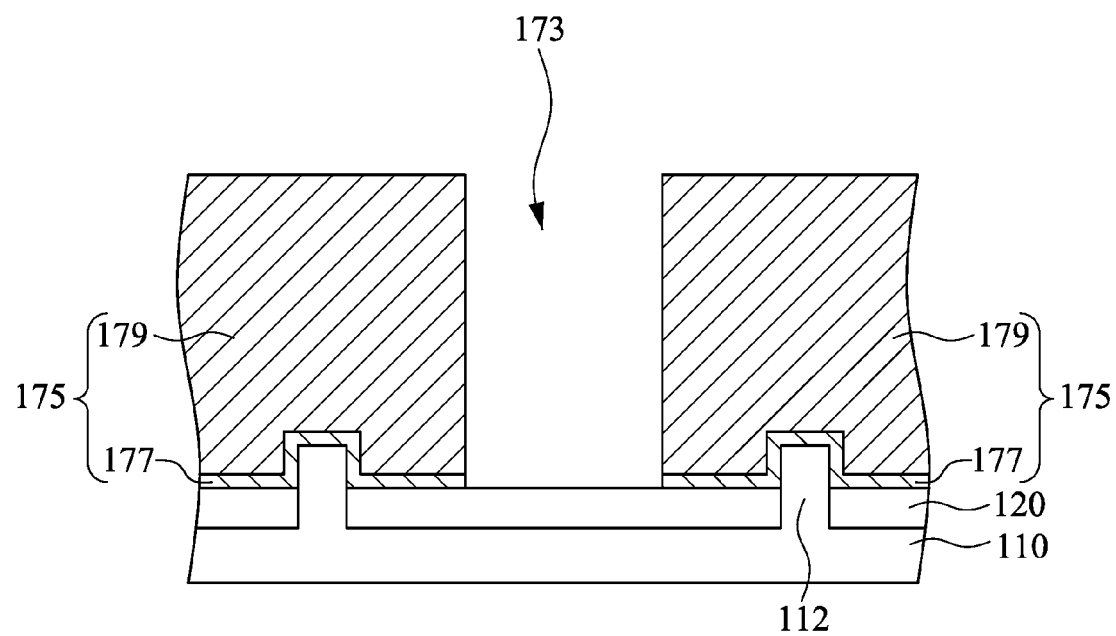

FIGS. 6A to 9A are perspective views of a method for manufacturing a semiconductor device at various stages in accordance with some embodiments of the present disclosure, FIGS. 6B to 9B are cross-sectional view respectively taking along line A-A of FIGS. 6A to 9A, FIGS. 6C to 9C are cross-sectional view respectively taking along line B-B of FIGS. 6A to 9A, and FIGS. 6D to 9D are cross-sectional view respectively taking along line C-C of FIGS. 6A to 9A. The manufacturing processes of FIGS. 1A to 1D are performed in advance. Since the relevant manufacturing details are similar to FIGS. 1A to 1D, and, therefore, a description in this regard will not be repeated hereinafter. Reference is made to FIGS. 6A to 6C. The ILDs 160 and 150 of FIGS. 1A-1D are patterned to form a trench T therein and between the two gate structures 130 by various methods, including a dry etch, a wet etch, or a combination of dry etch and wet etch. The trench T exposes portions of the semiconductor fins 112. In some embodiments, the trench T exposes portions of epitaxial layers if the epitaxial layers are formed on the semiconductor fins 112. The remained ILDs 160 form ILDs 162, which are formed as the sidewalls of the trench T. Furthermore, the ILD 150 is completely removed to form a larger trench T than the trench T of FIG. 2. Therefore, the gate spacers 140 are exposed by the trench T and are as the sidewall of the trench T. Moreover, in some embodiments, portions of the gate spacers 140 are removed to widen the trench T. The trench T has an extension direction substantially the same as the extension direction D1 of the gate structure 130.

Reference is made to FIGS. 7A-7D. A conductive strip 170 is formed in the trench T of FIGS. 6A-6D. The conductive strip 170 is electrically connected to the semiconductor fins 112 (and/or the epitaxial layer formed thereon). In some embodiments, metal materials can be filled in the trench T, and the excessive portions of the metal materials are removed by performing a CMP process to form the conductive strip 170. The conductive strip 170 is in contact with the gate spacers 140 and ILDs 162.

In some embodiments, the conductive strip 170 includes a barrier metal layer 172 and a contact metal layer 174. The barrier metal layer 172 is substantially conformally formed in the trench T, and the contact metal layer 174 is formed on the barrier metal layer 172. The contact metal layer 174 can fill the trench T. In some embodiments, a CMP process is applied to remove excessive the barrier metal layer 172 and the contact metal layer 174 outside the trench T. The barrier metal layer 172 may include metal nitride materials. For example, the barrier metal layer 172 includes Ti, TiN, or combination thereof. In some embodiments, the barrier metal layer 172 includes a single layer or multiple layers. For a multiple-layer configuration, the layers include different compositions of metal nitride from each other. For example, the barrier metal layer 172 has a first metal nitride layer including Ti and a second metal nitride layer including TiN. The contact metal layer 174 can be made of tungsten, aluminum, copper, or other suitable materials.

Reference is made to FIGS. 8A-8D. The conductive strip 170 is patterned to form a through hole 173 therein and between the semiconductor fins 112 and between the gate structures 130, and the remained portions of the conductive strip 170 form two contacts 175. The contact 175 includes a barrier metal 177 and a contact metal 179 disposed on the barrier metal 177. The through hole 173 exposes a portion of the isolation feature 120, and the contacts 175 are respectively and electrically connected to the semiconductor fins 112. In FIGS. 8A-8D, the gate spacer 140 is disposed between the contact 175 and the gate structure 130. That is, the contact 175 is in contact with the gate spacer 140.

Reference is made to FIGS. 9A-9D. An isolation pillar 180 is formed in the through hole 173 (see FIG. 8A). The isolation pillar 180 may be formed by chemical vapor deposition (CVD), high-density plasma CVD, spin-on, sputtering, or other suitable methods. In some embodiments, the isolation pillar 180 includes silicon oxide. In some other embodiments, the isolation pillar 180 may include silicon oxy-nitride, silicon nitride, or a low-k material. In some embodiments, dielectric materials can be deposited on the structure of FIGS. 8A-8D, and excessive portions of the dielectric materials outside the through hole 173 are removed by performing a CMP process to form the isolation pillar 180. As such, the isolation pillar 180 is integrally formed.

Figure 9A:
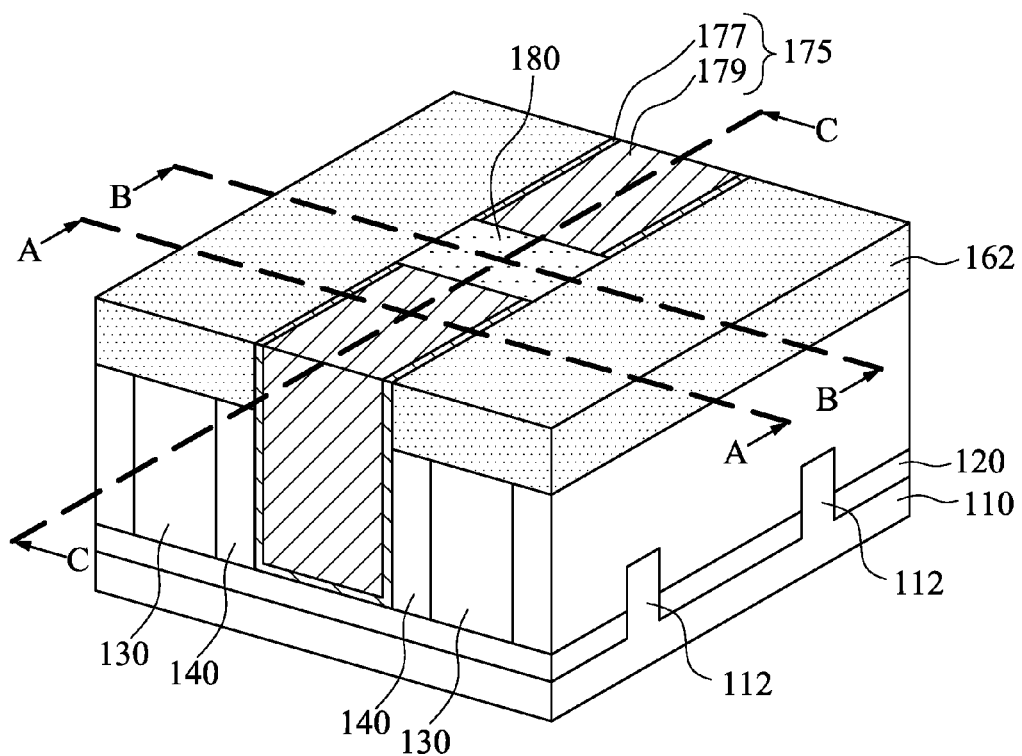
Figure 9B:
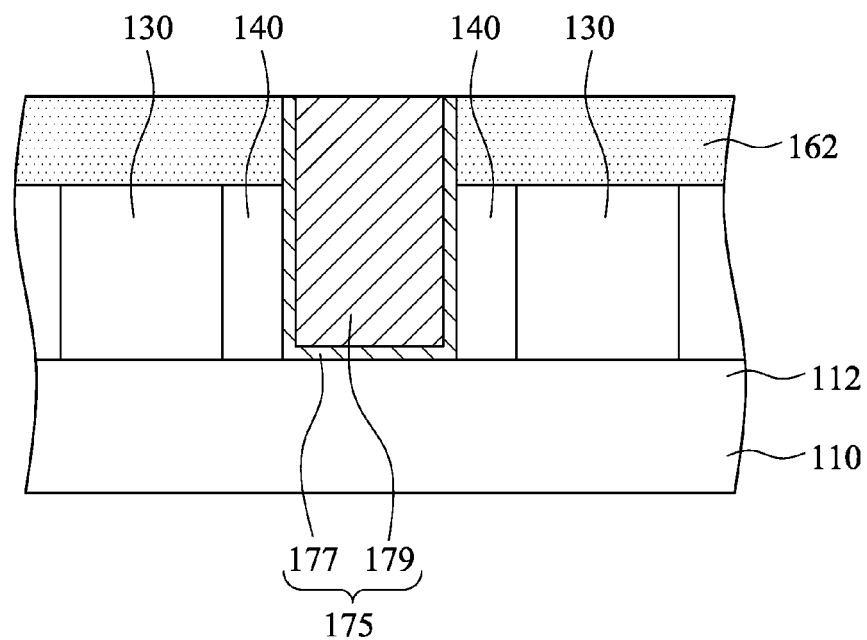

Reference is made to FIG. 9B. The contacts 175 are in contact with the ILDs 152 and 162. The barrier metal 177 of the contacts 175 is in contact with the ILDs 152 and 162, but the contact metal 179 of the contact 175 is separated from the ILDs 152 and 162 by the barrier metal 177.

Figure 9C:
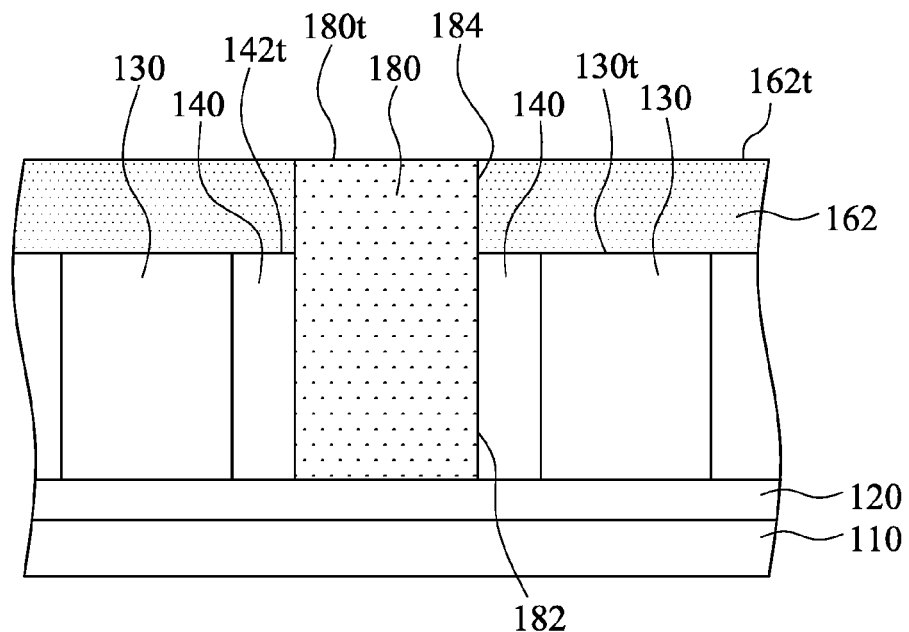

Reference is made to FIG. 9C. The isolation pillar 180 is disposed in the through hole 173, such that the isolation pillar 180 is in contact with the gate spacers 140 and the ILDs 162. An interface 182 is formed between the isolation pillar 180 and one of the gate spacers 140, and an interface 184 is formed between the isolation pillar 180 and one of the ILDs 162. The isolation pillar 180 and the ILDs 162 together form an isolation structure to isolate the two contacts 175. The isolation pillar 180 is disposed between the gate structures 130 but separated from the gate structures 130. That is, the gate spacer 140 is disposed between the isolation pillar 180 and the gate structure 130. In some embodiments, a top surface 180t of the isolation pillar 180 is higher than a top surface 130t of the gate structure 130, and the top surface 180t is also higher than a top surface 140t of the gate spacer 140. In some embodiments, the top surface 180t of the isolation pillar 180 and a top surface 162t of the ILD 162 can be substantially co-planar.

Figure 9D:
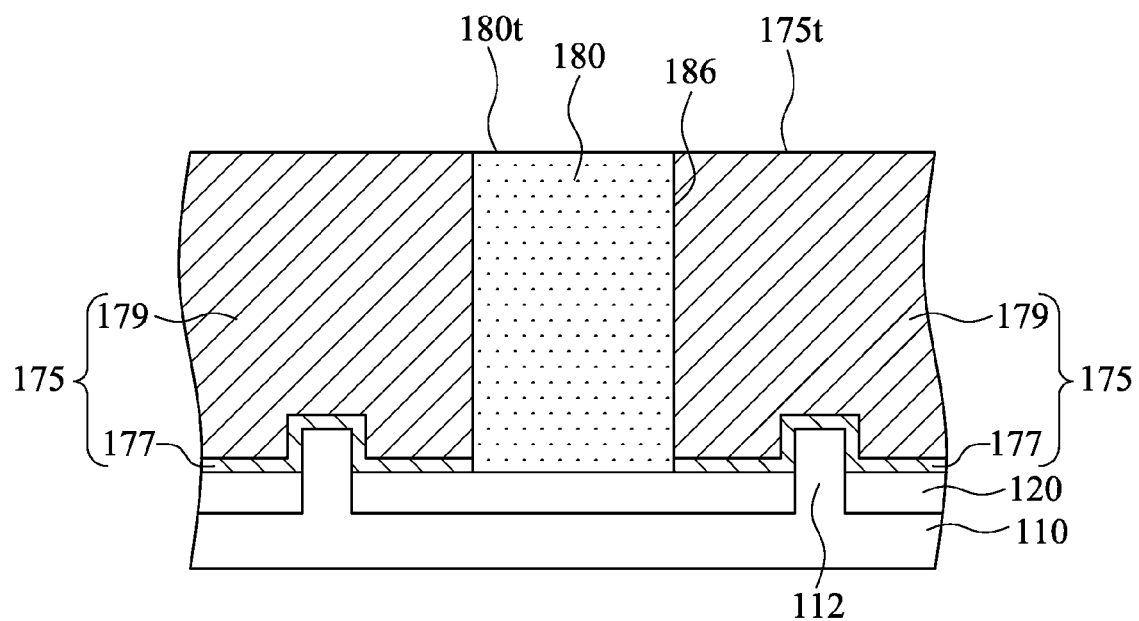

Reference is made to FIG. 9D. The isolation pillar 180 is disposed between the contacts 175 and at least one sidewall 186 of the isolation pillar 180 is in contact with the barrier metal 177 and the contact metal 179 of the contacts 175. The isolation pillar 180 is further in contact with the isolation feature 120 and is separated from the semiconductor fins 112. In some embodiments, the top surface 180t of the isolation pillar 180 and a top surface 175t of the contact 175 can be substantially co-planar.

With such configuration, the size of the isolation pillar 180 can be reduced, and the size of the contacts 175 can be increased even the size of the semiconductor device is shrunk. Furthermore, since the trench T (rather than two individual holes for two individually contacts) is formed, the filling window for the conductive strip 170 is enlarged. Hence, the conductive strip 170 has a good filling performance to provide a good electrical performance between the contacts 175 and the source/drain features (i.e., the semiconductor fins 112 in this case). Also, this configuration can improve the shortage problem between the contacts 175 and the gate structures 130 since the formation of the trench T have a good control rather than the formation of the two individual holes and the contacts 175 can be formed in desired shapes.

According to some embodiments, a semiconductor device includes a substrate, a source/drain feature, a gate structure, a top interlayer dielectric (ILD), a contact, and an isolation pillar. The source/drain feature is at least partially disposed in the substrate. The gate structure is disposed on the substrate and adjacent to the source/drain feature. The top ILD is disposed on the gate structure. The contact is disposed on the source/drain feature. The contact includes a barrier metal and a contact metal. The barrier metal is disposed on and in contact with the source/drain feature. The contact metal is disposed on the barrier metal. The isolation pillar is disposed adjacent to the contact. The isolation pillar is in contact with the barrier metal and the contact metal of the contact and the top ILD.

According to some embodiments, a semiconductor device includes a substrate, a first source/drain feature, a second source/drain feature, a gate structure, a top interlayer dielectric (ILD), a first contact, a second contact, and an isolation pillar. The first source/drain feature and the second source/drain feature are at least partially disposed in the substrate. The gate structure is disposed on the substrate and adjacent to the first source/drain feature and the second source/drain feature. The top ILD is disposed on the gate structure. The first contact and the second contact are respectively disposed on the first source/drain feature and the second source/drain feature. The isolation pillar is disposed between the first contact and the second contact. An interface is formed between the isolation pillar and the top ILD.

According to some embodiments, a method for manufacturing a semiconductor device includes forming a first source/drain feature and a second source/drain feature at least partially in the substrate. A gate structure is formed on the substrate and adjacent to the first source/drain feature and the second source/drain feature. A bottom ILD is formed adjacent to the gate structure. A top ILD is formed to cover the bottom ILD and the gate structure. A trench is formed in the top ILD and the bottom ILD to expose the first source/drain feature and the second source/drain feature. A conductive strip is formed in the trench. The conductive strip is patterned to form a through hole and two contacts respectively on the first source/drain feature and the second source/drain feature. An insulation pillar is formed in the through hole and in contact with the contacts.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor device, the method comprising:
   forming a first source/drain feature and a second source/drain feature at least partially in the substrate;
   forming a gate structure on the substrate and adjacent to the first source/drain feature and the second source/drain feature;
   forming a bottom ILD adjacent to the gate structure;
   forming a top ILD to cover the bottom ILD and the gate structure;
   forming a trench in the top ILD and the bottom ILD to expose the first source/drain feature and the second source/drain feature;
   forming a conductive strip in the trench;
   patterning the conductive strip to form a through hole and two contacts respectively on the first source/drain feature and the second source/drain feature; and
   forming an insulation pillar in the through hole and in contact with the contacts.

2. The method of claim 1, wherein the forming the conductive strip comprises:
   forming a barrier metal layer in the trench; and
   forming a contact metal layer in the trench and on the barrier metal layer.

3. The method of claim 1, further comprising forming an isolation feature in the substrate and between the first source/drain feature and the second source/drain feature, wherein the isolation pillar is formed on the isolation feature.

4. The method of claim 1, further comprising forming at least one gate spacer on a sidewall of the gate structure, and the isolation pillar is formed to be in contact with the gate spacer.

5. The method of claim 1, wherein the forming the trench comprises partially removing the bottom ILD.

6. The method of claim 1, wherein the forming the trench comprises completely removing the bottom ILD.

7. A method for manufacturing a semiconductor device, the method comprising:
   forming a semiconductor fin over a substrate;
   forming a gate structure over the semiconductor fin;
   forming an interlayer dielectric (ILD) over the semiconductor fin and adjacent to the gate structure;
   forming a conductive strip in the ILD, adjacent to the gate structure, and over the semiconductor fin;
   removing a portion of the conductive strip; and
   forming an insulation pillar in the ILD and in contact with the remained conductive strip.

8. The method of claim 7, further comprising forming a gate spacer on a sidewall of the gate structure.

9. The method of claim 8, wherein forming the conductive strip is such that the conductive strip is in contact with the gate spacer.

10. The method of claim 7, wherein forming the conductive strip is such that a part of the ILD is between the conductive strip and the gate spacer.

11. The method of claim 7, further comprising forming an isolation feature adjacent to the semiconductor fin, and the gate structure and the insulation pillar are formed over the isolation feature.

12. The method of claim 7, wherein forming the conductive strip comprises:
    forming a barrier metal layer in the ILD; and
    forming a contact metal layer over the barrier metal layer.

13. The method of claim 12, wherein removing the portion of the conductive strip comprises removing a portion of the barrier metal layer and a portion of the contact metal layer.

14. A method for manufacturing a semiconductor device, the method comprising:
    forming a source/drain feature at least partially in the substrate;
    forming a first gate structure and a second gate structure over the substrate;
    forming a conductive strip between the first gate structure and a second gate structure and over the source/drain feature;
    removing a portion of the conductive strip to form a contact electrically connected to the source/drain feature and a trench adjacent to the contact; and
    forming an insulation pillar in the trench and between the first gate structure and a second gate structure.

15. The method of claim 14, further comprising forming a gate spacer on a sidewall of the first gate structure.

16. The method of claim 15, wherein removing the portion of the conductive strip is such that the trench exposes the gate spacer.

17. The method of claim 14, further comprising forming an isolation feature adjacent to the source/drain feature, and the trench exposes the isolation feature.

18. The method of claim 14, wherein forming the conductive strip comprises:
    conformally forming a barrier metal layer between the first gate structure and the second gate structure; and
    forming a contact metal layer over the barrier metal layer and between the first gate structure and the second gate structure.

19. The method of claim 18, wherein removing the portion of the conductive strip is such that the trench exposes the barrier metal layer and the contact metal layer.

20. The method of claim 14, wherein forming the insulation pillar comprises:
    forming a dielectric material at least in the trench; and
    removing a portion of the dielectric material outside the trench to form the insulation pillar.

* * * * *